United States Patent [19]
Kozono

[11] Patent Number: 5,910,681
[45] Date of Patent: Jun. 8, 1999

[54] RESIN SEALED SEMICONDUCTOR DEVICE

[75] Inventor: Hiroyuki Kozono, Omiya, Japan

[73] Assignee: Kabushiki Kaisha Toshiba, Kawasaki, Japan

[21] Appl. No.: 08/846,506

[22] Filed: May 13, 1997

[30]     Foreign Application Priority Data

May 15, 1996  [JP]  Japan ..................................... 8-119815

[51] Int. Cl.⁶ .................................................. H01L 23/48
[52] U.S. Cl. .......................... 257/666; 257/676; 257/782; 257/787
[58] Field of Search .................................... 257/676, 700, 257/723, 666, 787, 796, 782

[56]            References Cited

U.S. PATENT DOCUMENTS 5,317,191  5/1994  Abe .......................................... 257/782
5,343,076  8/1994  Katayama et al. ....................... 257/700

FOREIGN PATENT DOCUMENTS 6-85132    3/1994  Japan ..................................... 257/676
681185 A5  1/1993  Switzerland ............................ 257/676

*Primary Examiner*—Peter Toby Brown
*Assistant Examiner*—Roy Potter
*Attorney, Agent, or Firm*—Finnegan, Henderson, Farabow, Garrett & Dunner, L.L.P.

[57]            ABSTRACT

In a resin-sealed semiconductor device, a semiconductor chip is mounted to a bed having a greater surface than that of the semiconductor chip. A lead section is comprised of a plurality of leads having their forward end portions arranged at given intervals around the semiconductor chip over the bed. The respective lead is connected by the tie bar to the bed. The bed, semiconductor chip, tie bars and portions of the leads are resin-sealed in a mold in such a way that a given surface side of the bed is exposed to an outside.

2 Claims, 5 Drawing Sheets

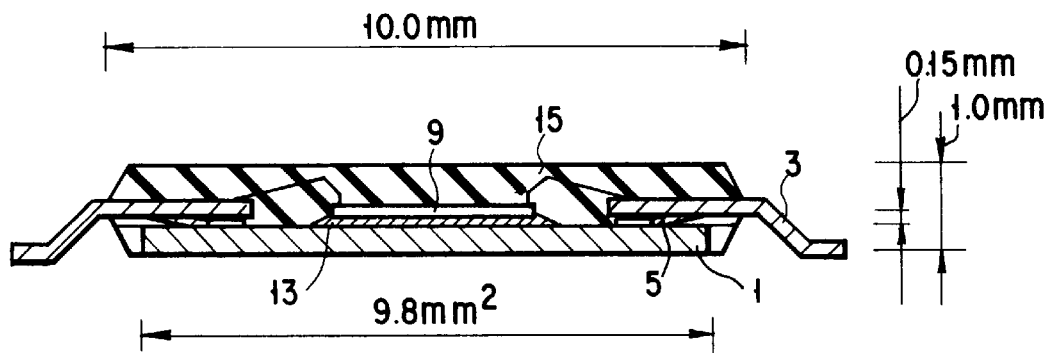
F I G. 10
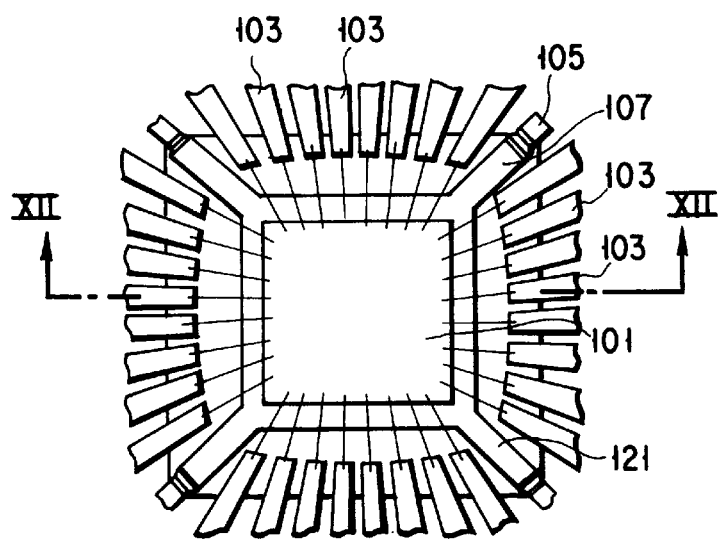
F I G. 11

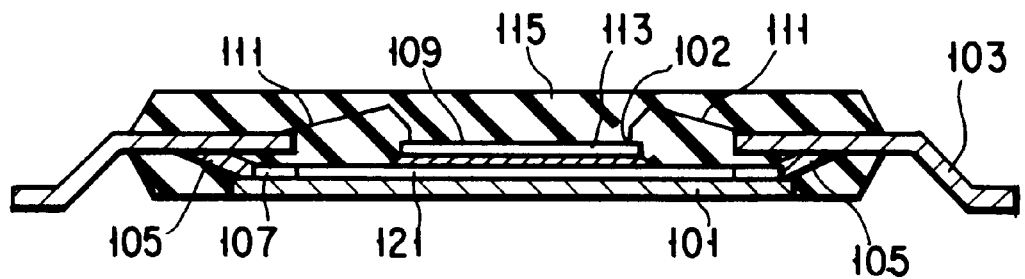
F I G. 12
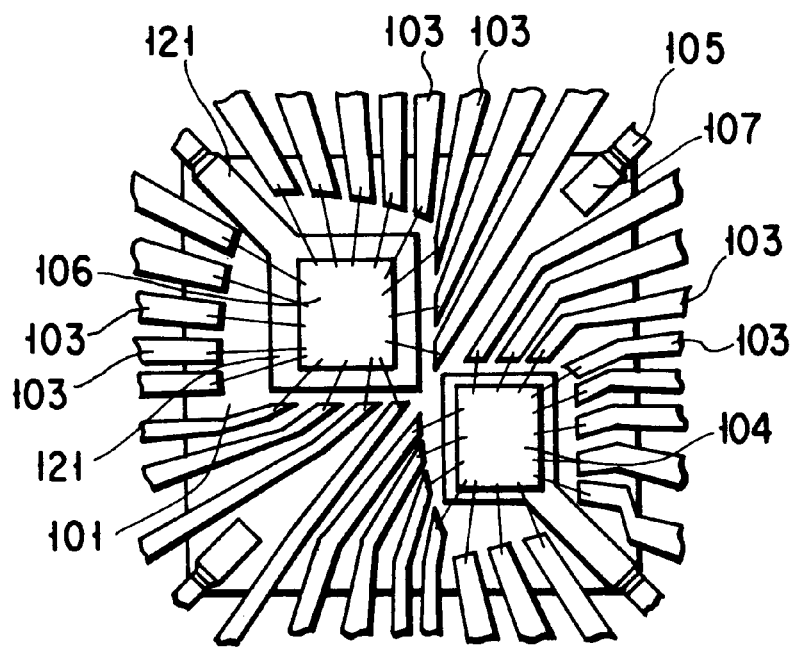
F I G. 13

RESIN SEALED SEMICONDUCTOR DEVICE

BACKGROUND OF THE INVENTION

The present invention relates to a resin sealed semiconductor device, and a method for manufacturing the same, which can ensure higher heat dissipation and higher quantity production.

In a recent demand for high integration density and high-speed characteristic, the semiconductor device needs a multi-pin structure and needs to be operated over a high frequency range. In such a high performance type semiconductor device, a semiconductor chip is mounted on a better heat dissipation bed in such a state as to expose the rear surface of the bed. By doing so, the semiconductor device achieves improved heat dissipation and high integration density and high performance throughout its whole system.

With reference to the drawing, explanation will be given below about the conventional resin sealed semiconductor device.

FIG. 1 is a plan view showing a conventional resin sealed semiconductor device of a first type, FIG. 2 is a bottom view thereof and FIG. 3 is a cross-sectional view thereof, taken along line III—III in a direction of arrows in FIG. 1.

A semiconductor chip 209 is bonded by a resin adhesive 213 to the central portion of a ceramics bed 201 as shown in FIG. 3. Electrodes 202 on the semiconductor chip 209 are electrically connected by wires 211 to leads 203 for signal transfer to an outside.

In this state, the bed 201 and semiconductor chips 209 are resin sealed and thus covered with the epoxy resin 215 except a bed surface side where no semiconductor chip is provided. This is done to improve heat dissipation.

The resin-sealing method of the resin-sealed semiconductor device is carried out by arranging the bed 201 in a mold, not shown, with the leads 203 held in place by a proper means and performing resin sealing. In this case, the forward end portions of the leads 203, that is, those portions of the leads connected to the wires 211, are arranged around the semiconductor chip 209.

The respective forward end portions of the leads 203 are placed within an upper surface area of the bed 201.

In the conventional resin-sealed semiconductor device of this first type, the bottom surface of the ceramics bed 201 area is made adequately larger than an area defined, over the bed, by the respective forward end surfaces of the leads 203 as viewed from the semiconductor chip 209 side, so that a greater external exposed area can be provided upon the resin sealing of the semiconductor device. This structure is excellent in that heat generated from the semiconductor chip 209 can be dissipated to an outside.

Since, however, the leads 203 and bed 201 are not respectively fixed in place, it is necessary to fix both by their associated members, respectively, upon the resin sealing of the semiconductor device. This requires a complex manufacturing process and prevents a quantity production.

With these in view, a second conventional resin-sealed semiconductor device has been conceived according to which both a bed and a plurality of leads are made of the same metal plate so as to achieve an improved quantity production.

FIG. 4 is a plan view showing a conventional resin-sealed semiconductor device of a second type, FIG. 5 is a bottom view thereof and FIG. 6 is a cross-sectional view thereof as taken along line VI—VI in a direction of arrows in FIG. 4.

A bed 301, leads 303 and tie bars 305 are punched out of a sheet of metal. A semiconductor chip 309 is bonded by a resin adhesive 313 to the central area of a bed 301. The leads 303 and electrodes 312 of the semiconductor chip 309 are electrically connected together by corresponding wires 311.

The bed 301, leads 303 and tie bars 305 are provided as an integral unit and, in this state, the bed 301 and semiconductor chip 309 are set in a mold, not shown, and sealed with an epoxy resin 315.

Further, in order to improve heat dissipation of the semiconductor chip, the bed 301 is exposed at a surface side where no semiconductor chip 309 is provided. In this resin-sealed semiconductor device, the bed and leads are formed by a punching method from the metal sheet and, since the bottom area of the bed 301 is made smaller than an area defined by the respective forward end portions of the leads 301 as viewed from the semiconductor chip 309 side, a smaller outer exposed area is provided upon the resin-sealing of the semiconductor device. As a result, the semiconductor chip 309 involves poor heat dissipation.

BRIEF SUMMARY OF THE INVENTION

It is accordingly the object of the present invention to provide a resin-sealed semiconductor device, and a method for manufacturing the same, which can solve the problem encountered in the prior art device by providing leads and bed as an integral fixed unit with a larger bottom surface of the bed exposed to an outside for high heat dissipation.

In order to achieve the above-mentioned object of the present invention there is provided a resin-sealed semiconductor device comprising:

a semiconductor chip;

a bed having a greater surface than that of the semiconductor chip and having the semiconductor chip mounted on one surface side;

a lead section comprised of a plurality of leads having those forward end portions arranged at given intervals around the semiconductor chip over the bed and electrically connected to the semiconductor chip;

tie bars connecting the leads to the bed; and a resin with which the bed, semiconductor chip, tie bars and portions of the leads are covered and sealed in a mold in such a state that the other surface side of the bed is exposed to an outside.

In another aspect of the present invention there is provided a method for manufacturing a resin-sealed semiconductor device comprising the steps of:

mounting a semiconductor chip to a bed having a greater surface area than that of the semiconductor chip;

arranging forward end portions of the leads of a lead section, at given intervals, around the semiconductor chip over the bed and fixing the lead section by the bars to the bed in such a state as to set the forward end portions of the leads within a given overlying area of the bed; and resin-sealing the bed, tie bars and portions of the leads in a mold in such a way that the bed is exposed on a surface side on which the semiconductor chip is not mounted.

According to the resin-sealed semiconductor device and method for manufacturing the same as set out above, the respective forward end portions of the leads are arranged around the semiconductor chip and, the bed bottom provides an adequate surface area relative to an area defined, over the bed 201, by the respective forward end portions of the leads 203 as viewed from the semiconductor chip side, so that it provides a larger surface area exposed to an outside. This specific structure ensures excellent heat dissipation generated in the semiconductor chip.

Further, the semiconductor chip-mounted bed and leads are joined in a firmly connected state and resin-sealed in a mold, thus providing a better method for ensuring a quantity production.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodi-ments given below, serve to explain the principles of the invention.

FIG. 10 is a practical form of the resin-sealed semiconductor device of the first embodiment of FIG. 9 with their dimension added;

FIG. 11 is a plan view showing a resin-sealed semiconductor device according to a second embodiment of the present invention;

FIG. 12 is an enlarged view, taken along line XII—XII in FIG. 11 with a semiconductor device structure in a resin-sealed state; and FIG. 13 is a plan view showing a variant of the resin-sealed semiconductor device of the present invention.

DETAILED DESCRIPTION OF THE INVENTION

The embodiment of the present invention will be explained below with reference to the accompanying drawing.

Figure 1:
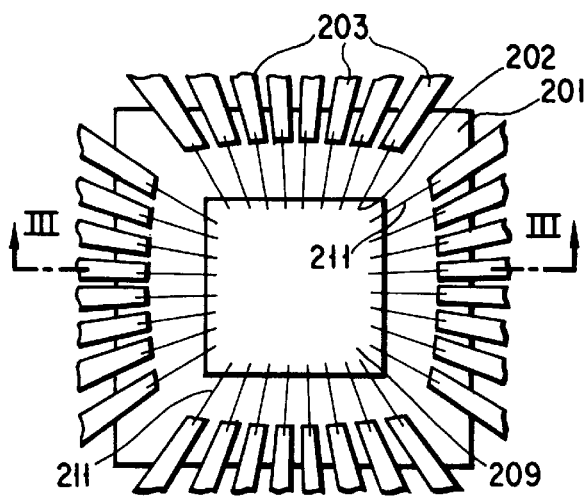
FIG. 1 is a plan view showing a conventional resin-sealed semiconductor device of a first type.
Figure 2:
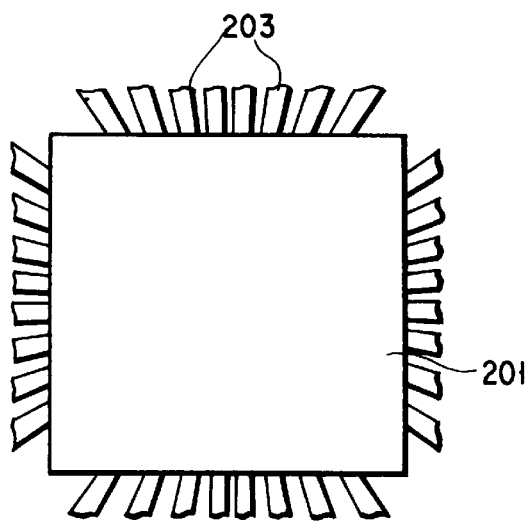
FIG. 2 is a bottom view showing the resin-sealed semiconductor device of FIG. 1.
Figure 3:
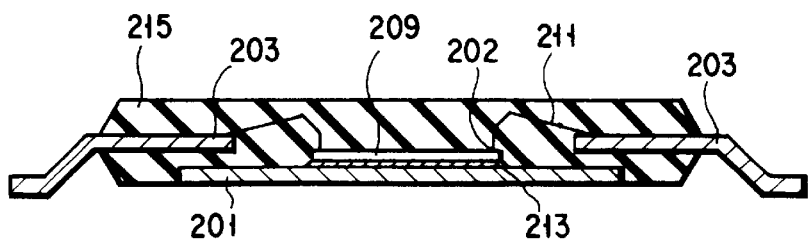
FIG. 3 is a cross-sectional view, as taken along line III—III in an arrow-indicated direction in FIG. 1.
Figure 4:
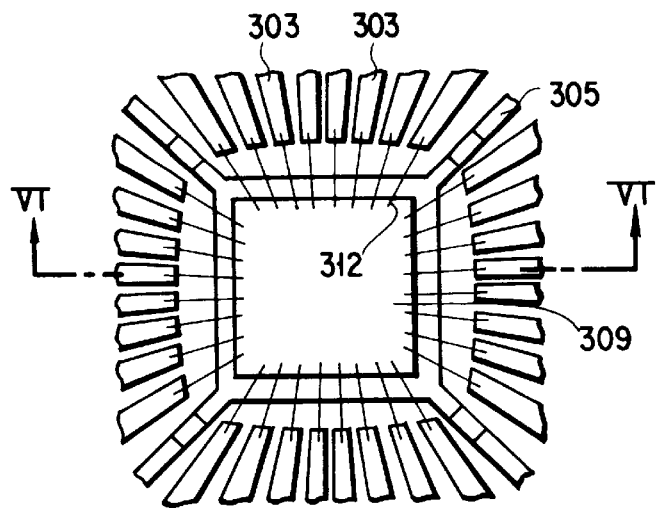
FIG. 4 is a plan view showing a conventional resin-sealed semiconductor device of a second type.
Figure 5:
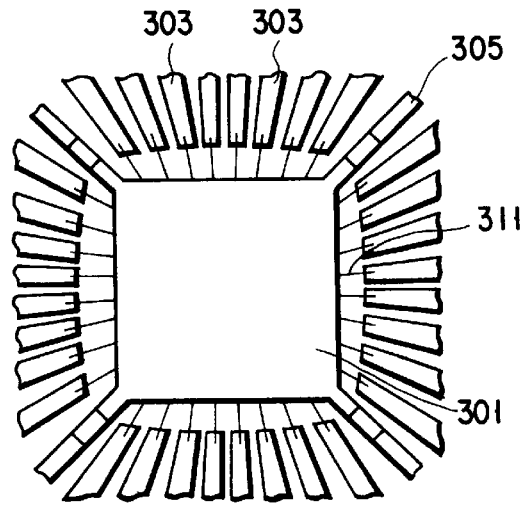
FIG. 5 is a bottom view showing the resin-sealed semiconductor device.
Figure 6:
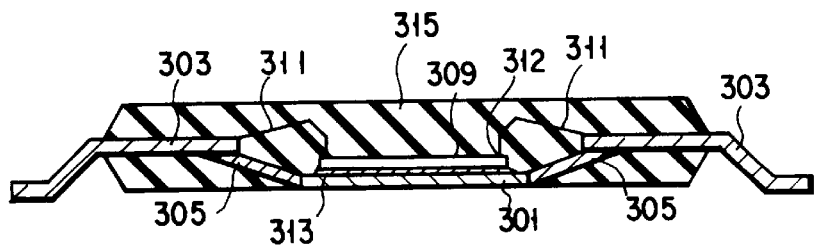
FIG. 6 is an enlarged view, taken along line VI—VI in an arrow-indicated direction in FIG. 4, showing the resin-sealed semiconductor device of FIG. 4.
Figure 7:
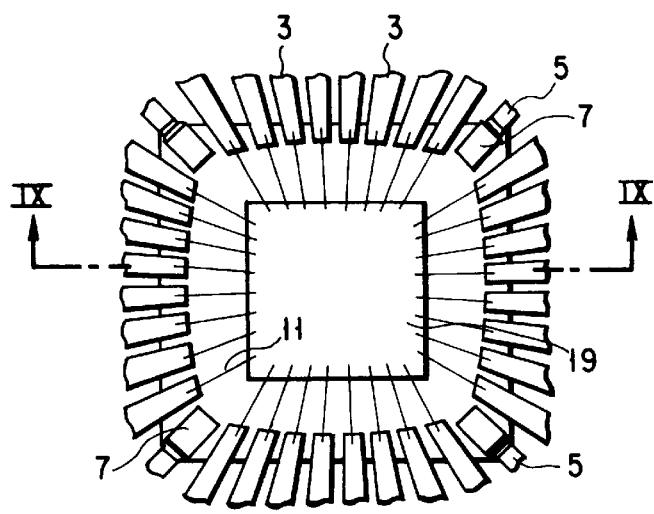
FIG. 7 is a plan view showing a resin-sealed semiconductor device showing a first embodiment of the present invention.
Figure 8:
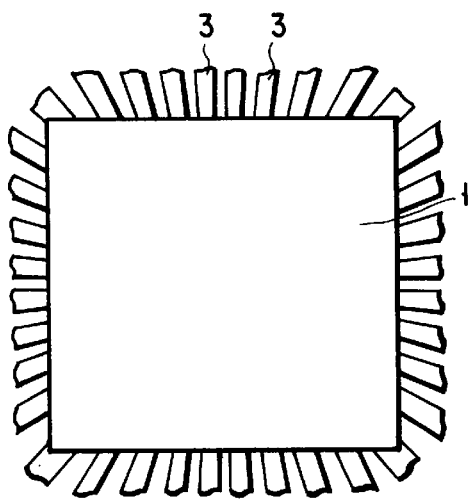
FIG. 8 is a bottom view showing a resin-sealed semiconductor device shown in FIG. 7.
Figure 9:
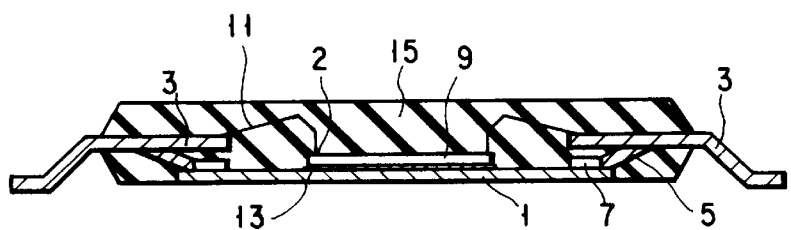
FIG. 9 is an enlarged view, as taken along line IX—IX in an arrow-indicated direction in FIG. 7, showing a semiconductor device structure in a resin-sealed state.

FIG. 7 is a plan view showing a resin-sealed semiconductor device according to a first embodiment of the present invention, FIG. 8 is a bottom view thereof, and FIG. 9 is an enlarged, cross-sectional view, taken along line IX—IX in an arrow direction in FIG. 7 with a semiconductor device structure in a resin-sealed state.

Leads 3 in a lead section and tie bars 5 are formed by a punching/blanking method from a sheet of metal, such as copper, and, in this case, the tie bars 5 are bent down from a horizontal position.

The tie bars 5 are joined, by silver brazing for instance, to a bed 1 made of ceramics and a semiconductor chip 9 is bonded by a resin adhesive 13 to the central area of the bed 1.

The leads 3 are provided as inner leads and their forward end portions connected to wires 11 are arranged at given intervals around the semiconductor chip 9.

The respective forward end portions of the leads are located within an upper surface range of the bed.

The leads 3 are electrically connected by the corresponding wires 11 to electrodes 12. In this state, the bed 1, semiconductor chip 9, tie bars 5 and portions of the leads are covered and sealed with an epoxy resin in a mold in which case the bed is exposed at that surface where the semiconductor chip is not provided.

Here, the exposed surface of the bed 1 ensures improved heat dissipation of the resin-sealed semiconductor device and, in the present embodiment, the bed 1 has its exposed surface side not covered with the epoxy resin 15 over the whole surface range.

Now explanation will be given about the manufacturing method of the semiconductor device of the above-mentioned first embodiment, in particular, about the resin-sealing method above.

First, the semiconductor chip-mounted bed 1 and tie-bars 5 integral with the leads 3 are fixed in place by a silver brazing method for instance. Then the thus fixed bed 1 and leads 3 are arranged in a mold, not shown, and sealed with an epoxy resin.

In the embodiment of the present invention, the bed 1 is so formed as to leave an exposed whole surface on that surface side where the semiconductor chip 9 is not mounted, that is, an exposed surface which ensures the heat dissipation of the semiconductor chip 9.

Since the resin-sealed semiconductor device has its separately formed bed 1 and leads 3 joined as set out above, the ceramics bed 1 provides an adequately larger area than an area defined, over the bed, relative to the forward end portions of the leads 3. This structure allows excellent heat dissipation of the semiconductor chip.

Further, since the semiconductor chip-mounted bed 1 and leads 3, after being firmly joined by silver brazing for instance, are sealed in a mold with the epoxy resin, it is possible to use the conventional facility or equipment, such as a resin sealing device (a mold), upon the resin sealing of the semiconductor device structure and to ensure a quantity production.

FIG. 10 shows a practical size of parts or portions of the resin-sealed semiconductor device of the first embodiment as shown in FIG. 9.

In the manufacture of a resin-sealed semiconductor device, if its bed 1 has a size of about 9.8 square millimeters and its tie bar 5 is bent to about 0.15 mm relative to its lead, the lead 3 is less likely to be contacted with the bed 1, so that it is possible to obtain a compact resin-sealed semiconductor device.

FIG. 11 is a plan view showing a resin-sealed semiconductor device according to a second embodiment of the present invention and FIG. 12 is an enlarged, cross-sectional view, as taken along line XII—XII in FIG. 11, showing a semiconductor device structure in a resin-sealed state.

In the second embodiment, a metal-plating pattern film is formed on a bed 101 at an area side where a semiconductor chip 109 is mounted.

First, leads 103 in a lead section and tie bars 105 are formed by a punching/blanking method from a metal sheet and, at this time, the tie bar 105 is bent down.

A gold plating film 121 for instance is formed on the bed 101 of ceramics at an area where the semiconductor chip 109 is provided. The gold plating film 121 is formed in contact with electrodes of the semiconductor chip 109 to allow a ready flow of a large-current.

The tie bar 105 is joined to the bed 101 by silver brazing 107.

The semiconductor chip 109 is attached by a resin adhesive 113 to the gold plating film 121 at the central area of the bed 101.

The leads 103 are electrically connected by wires 111 to corresponding electrodes 102 of the semiconductor chip 109. In this state, the bed 101, semiconductor chip 109 and leads 103 are thus set in place and sealed with an epoxy resin 115 in a mold.

The semiconductor chip 109 and portion of the bed 101 are covered with the epoxy resin 115 and the bed 101 is exposed at an area where the semiconductor chip 109 is not mounted.

The manufacturing method above is substantially similar to that of the above-mentioned first embodiment except that the metal plating film is formed on the bed 101 surface unlike the resin-sealed semiconductor device of the first embodiment.

FIG. 13 is a plan view showing a variant of the second embodiment, that is, a resin-sealed semiconductor device having a high heat generation large current-dissipation type semiconductor chip 106 and low heat generation low current-dissipation type semiconductor chip 104, both of which are mounted to the same bed 101.

A gold plating film 121 is provided over the surface of the bed 101 at an area where the large current dissipation type semiconductor chip 106 is provided and no gold plating film at an area where the low current dissipation type semiconductor chip 104 is provided.

Those leads 103 in a lead section are so provided as to be arranged around both the semiconductor chip 106 and the semiconductor chip 104.

This manufacturing method is substantially the same as that of the above-mentioned second embodiment and the bed 101, leads 103 and tie bars 105 are similarly sealed with a resin.

The bed 101 is exposed at those surface areas where neither the semiconductor chip 106 nor the semiconductor chip 104 are provided. As a result, it is possible to achieve improved heat dissipation of the large current dissipation type semiconductor chip 106.

Further, since a gold metal film is formed only at a desired surface area, it is possible to improve a quantity production.

In the second embodiment shown in FIGS. 11 and 12 and variant shown in FIG. 13, the bed 101 is formed separate from the leads 103 and, therefore, the bed 101 of ceramics provides an adequate exposed heat dissipation area relative to that defined surface area of the leads 103 around the semiconductor chip.

Further, since a better heat dissipation metal plating film 121 is formed at that area of the bed 101 where the semiconductor chi 109 is provided, this variant is excellent over the first embodiment in the heat dissipation of the semiconductor chip 109. The chip (109)-mounted bed 101 and leads 103 set in the connected state are sealed with the epoxy resin in a mold, so that accurate bed-to-lead positioning can be carried out in the bonding and resin bonding steps.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A resin-sealed semiconductor device comprising:

a bed;

a conductive film formed on the bed, wherein the conductive film has a plated surface;

a semiconductor chip on the conductive film;

a lead section comprised of a plurality of leads arranged at given intervals around the semiconductor chip over the bed and electrically connected to the semiconductor chip;

tie bars connected between the leads in the lead section and the bed, and having forward end portions of the plurality of leads positioned over an area of the bed; and a resin with which the semiconductor chip is covered and sealed in such a state that one surface of the bed is exposed to an outside.

2. A resin-sealed semiconductor device comprising:

a bed;

a conductive film formed on the bed;

a first semiconductor chip on the conductive film;

a second semiconductor chip mounted on the bed on the same surface side as the first semiconductor chip, there being no conductive film between the second semiconductor chip and the bed;

a lead section comprised of a plurality of leads arranged at given intervals around the semiconductor chip over the bed and electrically connected to the semiconductor chip;

tie bars connected between the leads in the lead section and the bed, and having forward end portions of the plurality of leads positioned over an area of the bed; and a resin with which the semiconductor chip is covered and sealed in such a state that one surface of the bed is exposed to an outside.

* * * * *